United States Patent
Gambino et al.

(10) Patent No.: US 9,865,674 B2
(45) Date of Patent: *Jan. 9, 2018

(54) LOW TEMPERATURE FABRICATION OF LATERAL THIN FILM VARISTOR

(71) Applicant: International Business Machines Corporation, Armonk, NY (US)

(72) Inventors: Jeffrey P. Gambino, Westford, VT (US); Richard S. Graf, Gray, ME (US); Sudeep Mandal, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/386,256

(22) Filed: Dec. 21, 2016

(65) Prior Publication Data

US 2017/0104054 A1   Apr. 13, 2017

Related U.S. Application Data

(63) Continuation of application No. 14/885,512, filed on Oct. 16, 2015, now Pat. No. 9,536,732, which is a
(Continued)

(51) Int. Cl.
*H01L 49/02* (2006.01)
*H01L 21/02* (2006.01)
(Continued)

(52) U.S. Cl.
CPC ........... *H01L 28/24* (2013.01); *H01C 7/1013* (2013.01); *H01C 7/112* (2013.01); *H01C 7/12* (2013.01);
(Continued)

(58) Field of Classification Search
None
See application file for complete search history.

(56) References Cited

U.S. PATENT DOCUMENTS

| | | |
|---|---|---|
| 3,768,058 A | 10/1973 | Harnden, Jr. |
| 4,272,754 A | 6/1981 | Lou |

(Continued)

FOREIGN PATENT DOCUMENTS

WO   WO2013/168311 A1   11/2013

OTHER PUBLICATIONS

Lu et al., "Structures, varistor properties, and electrical stability of ZnO thin films", Material Letters 63 (2009) received Feb. 28, 2009, Accepted Aug. 1, 2009, Available online Aug. 7, 2009, pp. 2321-2323.
(Continued)

*Primary Examiner* — Joseph Schoenholtz
(74) *Attorney, Agent, or Firm* — Scully, Scott, Murphy & Presser, P.C.; Tihon Poltavets, Esq.

(57) ABSTRACT

A structure and method for fabricating a laterally configured thin film varistor surge protection device using low temperature sputtering techniques which do not damage IC device components contiguous to the varistor being fabricated. The lateral thin film varistor may include of a continuous layer of alternating regions of a first metal oxide layer and a second metal oxide layer formed between two laterally spaced electrodes using a low temperature sputtering process followed by a low temperature annealing process.

17 Claims, 6 Drawing Sheets

Related U.S. Application Data continuation of application No. 14/632,074, filed on Feb. 26, 2015, now Pat. No. 9,356,089.

(51) Int. Cl.
| | |
|---|---|
| *H01C 7/10* | (2006.01) |
| *H01C 7/112* | (2006.01) |
| *H01C 17/00* | (2006.01) |
| *H01C 7/12* | (2006.01) |
| *H01L 27/02* | (2006.01) |
| *H01L 23/64* | (2006.01) |
| *H01L 21/762* | (2006.01) |
| *H01L 23/522* | (2006.01) |
| *H01L 23/528* | (2006.01) |
| *H01L 23/62* | (2006.01) |
| *H01L 29/06* | (2006.01) |
| *H01C 17/12* | (2006.01) |

(52) U.S. Cl.
CPC ........... *H01C 17/006* (2013.01); *H01C 17/12* (2013.01); *H01L 21/022* (2013.01); *H01L 21/02175* (2013.01); *H01L 21/02266* (2013.01); *H01L 21/762* (2013.01); *H01L 23/528* (2013.01); *H01L 23/5226* (2013.01); *H01L 23/62* (2013.01); *H01L 23/647* (2013.01); *H01L 27/0248* (2013.01); *H01L 29/0649* (2013.01)

(56) References Cited

U.S. PATENT DOCUMENTS

| | | | |
|---|---|---|---|
| 4,809,044 | A | 2/1989 | Pryor et al. |
| 5,699,035 | A | 12/1997 | Ito et al. |
| 5,980,788 | A | 11/1999 | Katsumata et al. |
| 6,087,923 | A | 7/2000 | Ahn et al. |
| 6,224,937 | B1 | 5/2001 | Katsumata et al. |
| 6,538,297 | B2 | 3/2003 | Odagawa et al. |
| 6,679,996 | B1 | 1/2004 | Yao |
| 8,242,875 | B2 | 8/2012 | Lim et al. |
| 8,558,654 | B2 | 10/2013 | Le Neel et al. |
| 9,356,089 | B1 | 5/2016 | Gambino et al. |
| 9,536,732 | B2 * | 1/2017 | Gambino .......... H01L 21/02266 |
| 2002/0056884 | A1 | 5/2002 | Baliga |
| 2008/0266045 | A1 | 10/2008 | den Boer |
| 2008/0297302 | A1 | 12/2008 | Chang et al. |

OTHER PUBLICATIONS

Miśta et al., "Varistor performance of nanocrystalline Zn—Bi—O thin films prepared by reactive RF magnetron sputtering at room temperature", Vacuum 74 (2004) Accepted Dec. 22, 2003, www.elsevier.com/locate/vacuum, pp. 293-296.

List of IBM Patents or Patent Applications Treated As Related.

Office Action dated Feb. 13, 2016, received in the U.S. Appl. No. 15/149,652.

Office Action, dated May 30, 2017, received in a related U.S. Appl. No. 15/149,652.

\* cited by examiner

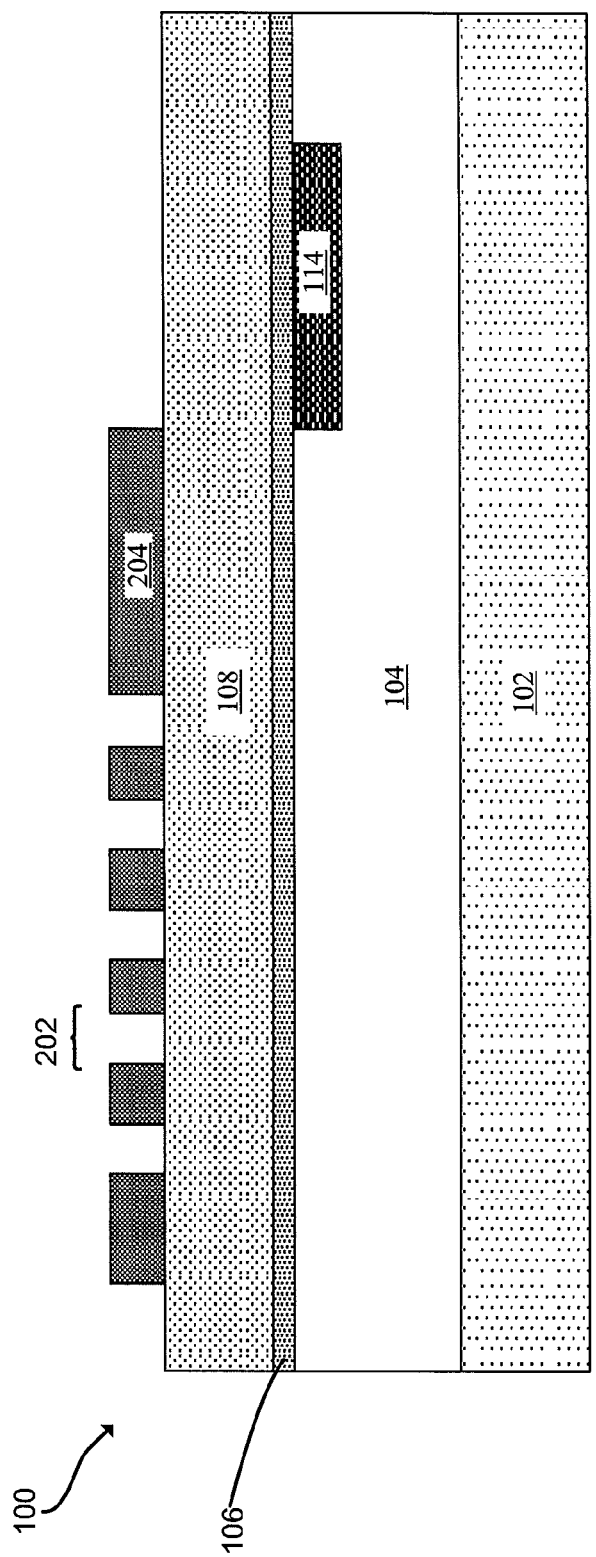
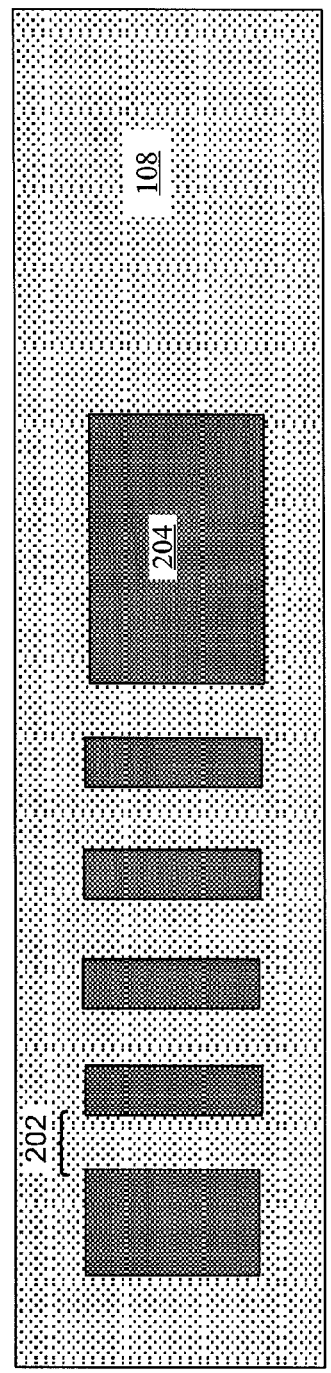
FIG. 2A
FIG. 2B

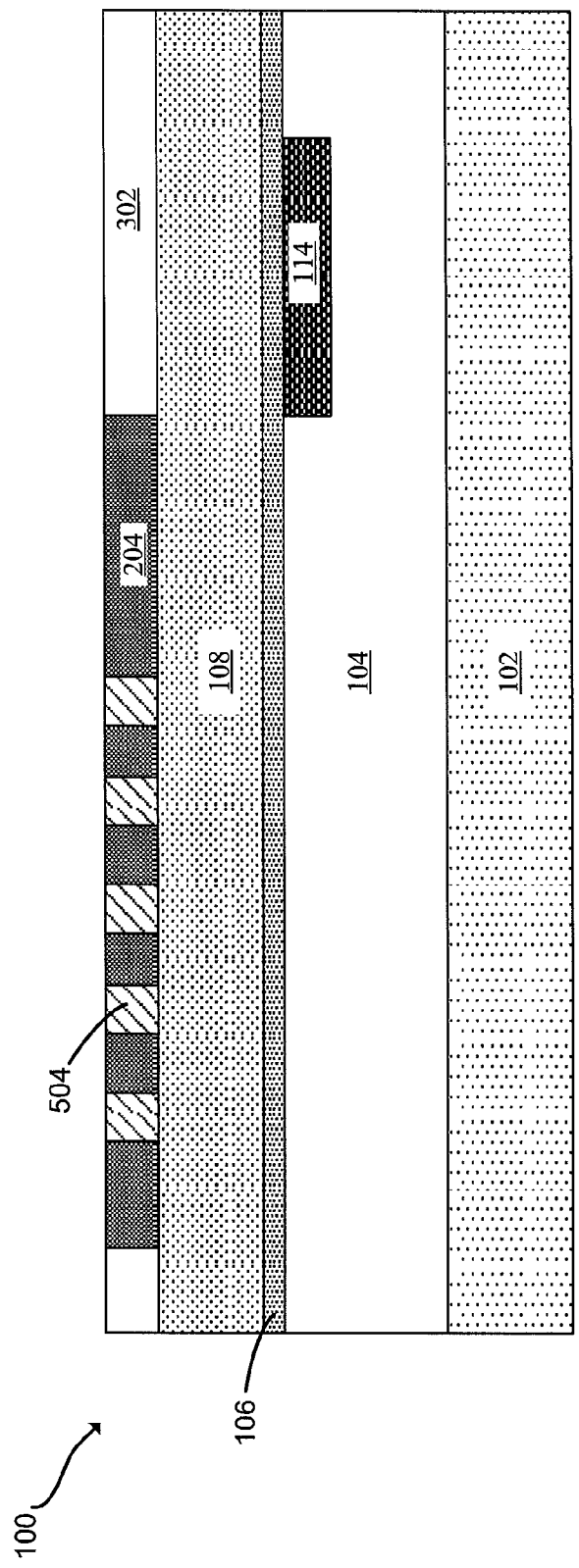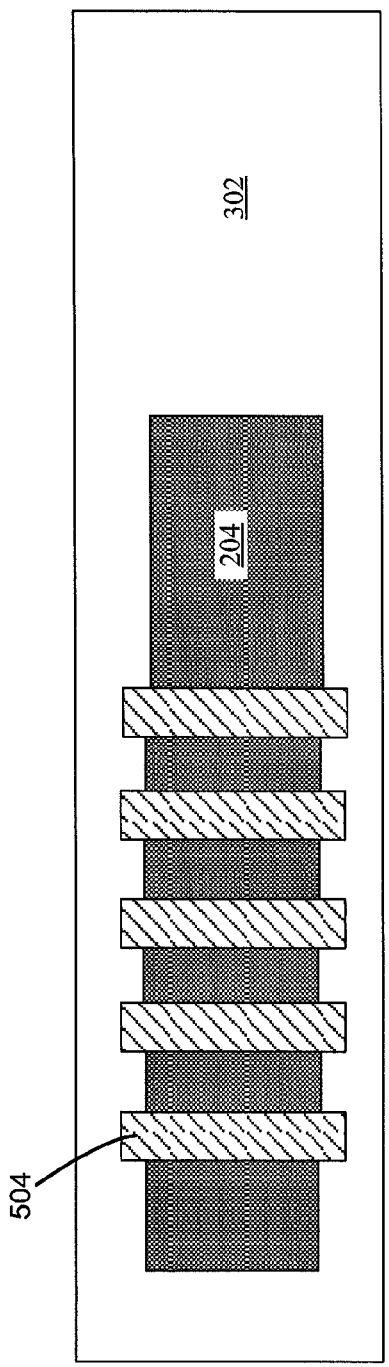

LOW TEMPERATURE FABRICATION OF LATERAL THIN FILM VARISTOR

CROSS REFERENCE TO RELATED APPLICATION

This application is a continuation of copending U.S. patent application Ser. No. 14/885,512, filed Oct. 16, 2015, which is a continuation of U.S. patent application Ser. No. 14/632,074, filed Feb. 26, 2015. The entire contents and disclosures of U.S. patent application Ser. No. 14/885,512 and Ser. No. 14/632,074 are hereby incorporated herein by reference.

BACKGROUND

The present invention relates generally to integrated circuits (IC), and more particularly to a structure and method for fabricating a laterally configured thin film varistor surge protection device using low temperature sputtering techniques which do not damage IC device components contiguous to the varistor being fabricated.

High performance IC chips tend to suffer from transient voltages that can damage device components embedded within them. In particular, devices manufactured on thin film substrates are highly sensitive to electrostatic discharge (ESD). Conventional ESD protection devices are typically not robust enough for applications where high current transients are common. For example, silicon controlled rectifier (SCR) devices or generic transient voltage suppression (TVS) devices may not be suitable for ESD protection of radio frequency (RF) circuits manufactured on thin films, as thin film substrates are more sensitive to transient voltages compared to thick film substrates.

Varistors are non-ohmic devices that help protect sensitive IC components against such transient voltages. A varistor's resistance to the flow of electricity changes based on changes in the electric field. While a varistor remains non-conductive during normal operation voltages, its electrical resistance starts to decrease as voltage is raised and when voltage is excessively high, such as during surges, the varistor starts to conduct the significantly increased current, thus shunting the current away from sensitive IC components. Unlike SCR and TVS devices, varistors are stable at higher transient voltages, and at higher temperatures caused by such higher transient voltages.

SUMMARY

According to an embodiment, a method is provided. The method may include forming a lateral thin film varistor by forming a continuous layer comprising alternating regions of a first metal oxide layer and a second metal oxide layer between two laterally spaced electrodes using a low temperature sputtering process followed by a low temperature annealing process.

In another embodiment, a method is provided. The method may include forming a lateral thin film varistor comprising forming a first metal oxide layer on a dielectric layer; removing a portion of the first metal oxide layer to form a first opening, the first opening exposing an upper surface of the dielectric layer; forming an isolation layer on the dielectric layer, the isolation layer adjacent to the first metal oxide layer and in the first opening; removing a portion of the isolation layer from the first opening to expose the upper surface of the dielectric layer; forming a second metal oxide layer in the opening, wherein the first metal oxide layer and the second metal oxide layer comprise a continuous alternating layer; removing a portion of the isolation layer adjacent to the continuous alternating layer to form a second opening, the second opening exposing an upper surface of the dielectric layer; and forming an electrode in the second opening, the electrode adjacent to and contacting the continuous alternating layer.

In another embodiment, a structure is provided. The structure may include a lateral thin film varistor including of a continuous layer comprising alternating regions of a first metal oxide layer and a second metal oxide layer located between, and in contact with, two laterally spaced electrodes.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 2A is a cross section view and FIG. 2B is a top view, both illustrating forming a first metal oxide film pattern, according to an embodiment of the present invention.

FIG. 5A is a cross section view and FIG. 5B is a top view, both illustrating depositing and patterning a second metal oxide, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
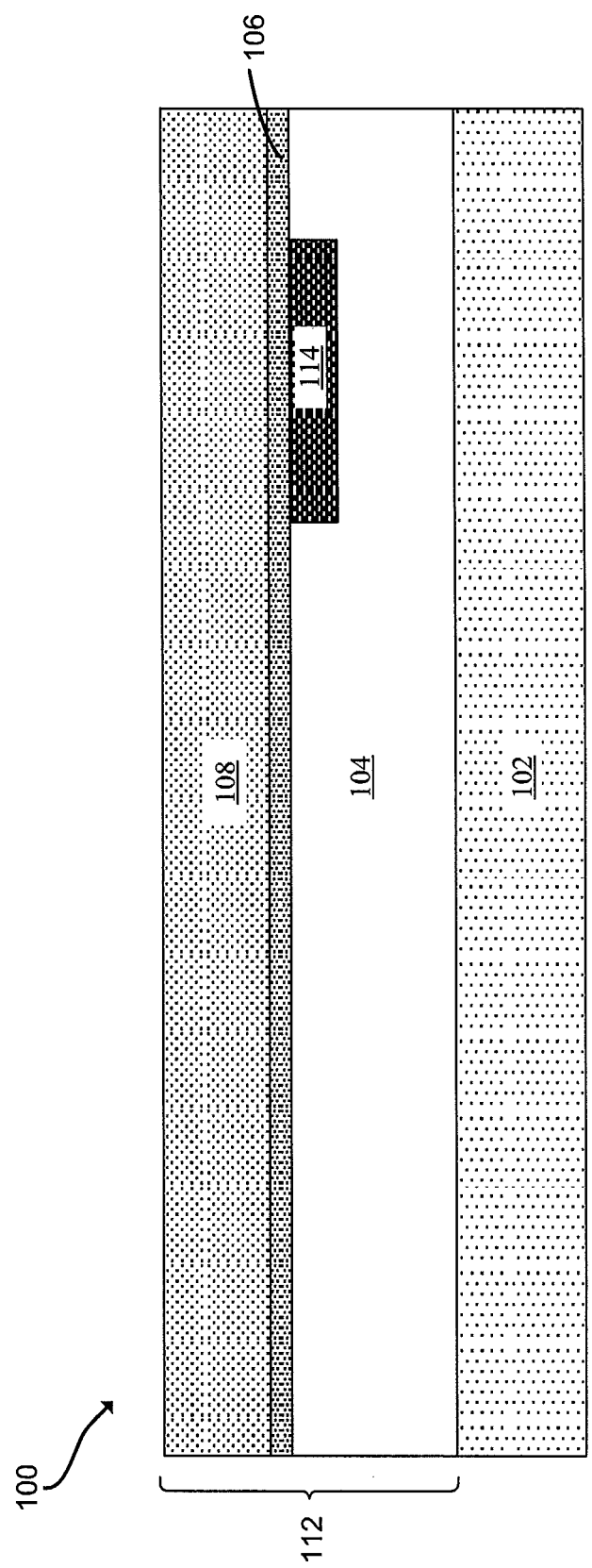
FIG. 1 is a cross section view illustrating a preliminary structure of a lower wiring level $M_x$ of an IC chip, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to integrated circuits, and more particularly to a structure and method of fabricating a lateral thin film varistor surge protection device. Conventional thin film varistors are generally configured for vertical flow of transient currents between vertically placed electrodes. As IC chips continue to get more and more compact in size while simultaneously incorporating increasing number of devices and functions within them, and as wiring levels continue to get shorter, such vertical varistor configurations start imposing space limitations. In addition, conventional methods of forming vertical film varistors, which may have body materials of composite oxides such as zinc oxide or bismuth oxide, may utilize high temperature sintering at temperatures between 1000° C. and 1300° C. Such high temperatures can cause permanent damage to sensitive semiconductor device components contiguous to the varistor being fabricated.

Therefore, it may be advantageous to form a laterally configured thin film varistor that takes up minimal vertical space using low temperature sputtering techniques followed by low temperature annealing treatment. The electrodes that connect to this thin film varistor too may be laterally placed, and fabricated using similar low temperature sputtering techniques followed by low temperature annealing treatment. This laterally arranged thin film type varistor may be fabricated on thin film IC chip substrates such that the varistor and the electrodes are both configured for lateral flow of transient voltages. Embodiments of such a lateral thin film varistor and methods by which to form it are described below in detail with reference to FIGS. 1-6B.

Referring now to FIG. 1, a cross-sectional view of a preliminary structure 100 that may be used as a possible starting point of the fabrication of the lateral thin film varistor is shown. Structure 100 may include a lower wiring level ($M_x$) 112 of a chip sitting on a substrate 102 and including a first dielectric layer 104 with a conductive feature 114 embedded therein, a capping layer 106, and a second dielectric layer 108.

In an embodiment, the substrate 102 may either be a thin film substrate, a bulk substrate or a semiconductor on insulator (all) substrate. The substrate 102 may be composed of any semiconductor material typically known in the art, including, for example, silicon, germanium, silicon-germanium alloy, silicon carbide, silicon-germanium carbide alloy, and compound (e.g. II-VI) semiconductor materials. The substrate 102 may include one or more vias (not shown) and/or one or more semiconductor devices (not shown).

A first dielectric layer 104 may be formed on substrate 102 by a conventional deposition process, such as, for example, atomic layer deposition (ALD), chemical vapor deposition (CVD), physical vapor deposition (PVD), molecular beam deposition (MBD), pulsed laser deposition (PLD), liquid source misted chemical deposition (LSMCD), or sputtering. In an embodiment the substrate 102 may be thermally oxidized by conventional oven baking in oxygen to produce the first dielectric layer 104 composed of silicon dioxide on an upper surface of the substrate 102.

The first dielectric layer 104 may be composed of any interlevel or intralevel dielectric material, including inorganic dielectrics and organic dielectrics. The first dielectric layer 104 may be porous or non-porous. In an embodiment, the first dielectric layer 104 may be composed of a low-k dielectric material including, but not limited to, an oxide and/or silicates. A "low-k" material is a dielectric material with a lower dielectric constant relative to silicon dioxide ($SiO_2$), which is 3.9 (i.e., the ratio of the permittivity of $SiO_2$ divided by the permittivity of a vacuum). The first dielectric layer 104 may also include multiple layers of dielectric material in any combination known in the art. The thickness of the first dielectric layer 104 may vary depending upon the dielectric material used. In an embodiment, the first dielectric layer 104 may have a thickness ranging between approximately 100 nm and approximately 3000 nm. In a preferred embodiment, the first dielectric layer 104 may have a thickness ranging from approximately 200 nm to approximately 900 nm.

The conductive feature 114 may be formed in the first dielectric layer 104 by forming an opening (not shown) using a conventional patterning and etching process. The opening may then be filled with a conductive material using a conventional deposition process including, but not limited to ALD, CVD, PECVD, MBD, PLD, LSMCD, sputtering, chemical solution deposition, or plating. The conductive feature 114 may be composed of, for example, polySi, a conductive metal, a conductive metal silicide, or combinations thereof. In a preferred embodiment, the conductive material may be a conductive metal such as Cu, W, Al, or alloys thereof. After the conductive material is deposited, a conventional planarization process such as, for example, chemical mechanical polishing (CMP) may be performed so that the conductive feature 114 has an upper surface that is substantially flush with an upper surface of the first dielectric layer 104. In an embodiment, conductive feature 114 may represent either a line or a via. In an embodiment, the conductive feature 114 may be separated from the first dielectric layer 104 by a barrier layer (not shown).

A capping layer 106 may then be formed on the first dielectric layer 104 and the conductive feature 114. The capping layer 106 may be composed of any suitable dielectric capping material such as, for example, SiC, $Si_4NH_3$, SiC doped with nitrogen, oxygen, and/or hydrogen, or multilayers thereof. The capping layer 106 may be formed using a conventional deposition process such as, for example, ALD, CVD, PECVD, MBD, PLD, LSMCD, sputtering, chemical solution deposition, or evaporation. The thickness of the dielectric capping layer 106 may vary depending on the technique used to form the same as well as the material make-up of the layer. In an embodiment, the dielectric capping layer 106 may have a thickness ranging from approximately 15 nm to approximately 55 nm, with a thickness ranging from approximately 25 nm to approximately 45 nm being preferred.

The second dielectric layer 108 may then be formed on an upper surface of capping layer 106. The second dielectric layer 108 may be composed of substantially similar materials as the first dielectric layer 104 and may be formed using substantially similar techniques as those described above with reference to formation of the first dielectric layer 104.

Referring now to FIGS. 2A and 2B, a cross section view and a top view illustrating forming a first metal oxide layer 204 on the second dielectric layer 108 are shown. The first metal oxide layer 204 may be fabricated by depositing a blanket metal oxide layer (not shown) and then performing a conventional patterning and etching process to remove select portions. The blanket metal oxide layer may be deposited on the second dielectric layer 108 using low temperature sputtering techniques such as direct current (DC) sputtering, radio frequency (RF) sputtering, etc., as opposed to high temperature sintering which may damage semiconductor components and devices contiguous to the metal oxide layer being fabricated.

In an embodiment, the blanket metal oxide layer may be composed of zinc oxide (ZnO) that may or may not be doped with, for example, aluminum oxide ($Al_2O_3$). The blanket metal oxide layer may be deposited using a low temperature sputtering process in an atmosphere of an inert gas, such as argon, helium, neon, krypton, xenon, or radon. In an embodiment, the deposition temperature may remain below approximately 400° C. In an embodiment, after the blanket metal oxide is deposited, the structure 100 may be cooled by ramping the temperature down to room temperature. The process may result in the formation of a blanket metal oxide layer having a thickness ranging between approximately 50 nm and approximately 500 nm in which the size of the zinc crystal grains may range between approximately 10 nm and approximately 300 nm. Since the blanket metal oxide layer is deposited utilizing a low temperature sputtering process, the substrate 102 and adjacent devices (not shown) may remain undamaged.

The blanket metal oxide layer may be subjected to a low temperature anneal process at a temperature not exceeding approximately 350° C. for a period of between approximately 30 seconds and several hours. Such low temperature annealing may allow the physical properties of the blanket metal oxide layer to easily be controlled and tuned for optimal performance in the varistor. This post-annealing treatment may raise the resistance of the resulting metal oxide layer 204 to several tens of thousands of ohms resulting in excellent varistor performance. In an embodiment, the annealing process may be carried out at a temperature lower than the maximum temperature reached during the deposition of the first metal oxide layer 204. In another embodiment, the annealing process may be carried out at a temperature higher than the maximum temperature reached during the deposition of the first metal oxide layer 204.

The blanket metal oxide layer may then be patterned using a conventional patterning and etching process to form one or more openings 202 in the first metal oxide layer 204. The openings 202 may be formed by first depositing a photoresist material (not shown) on an upper surface of the first metal oxide layer 204. The photoresist material may then be patterned by a photolithography process to provide a photoresist pattern and then etched to form openings 202. The etching process may include a dry etching process such as reactive ion etching (RIE), ion beam etching, or plasma etching. The patterned photoresist may be removed after the etching process is completed. The openings 202 may have substantially vertical sidewalls and may expose an upper surface of the second dielectric layer 108.

Figure 3:
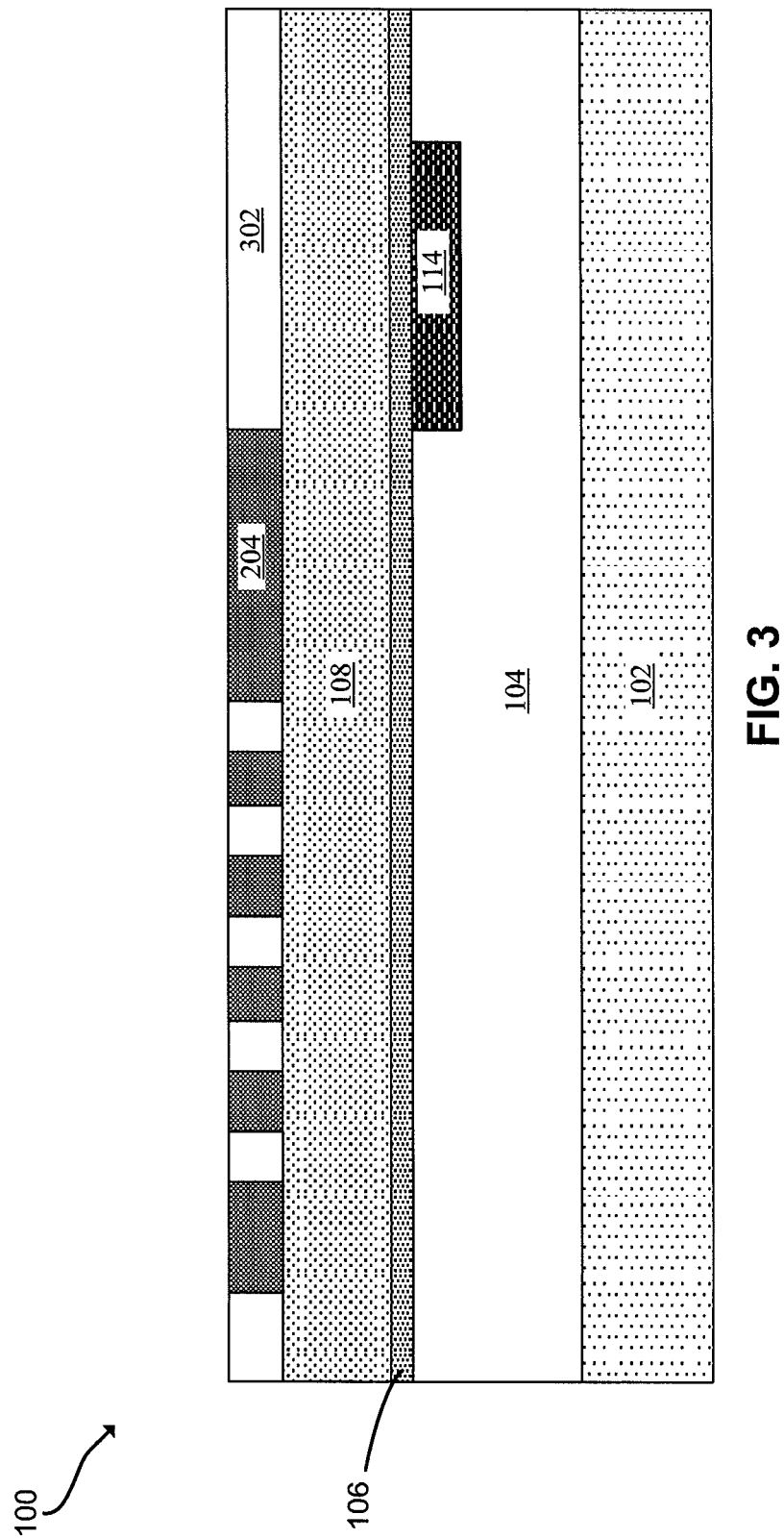
FIG. 3 is a cross section view illustrating depositing an isolation layer, according to an embodiment of the present invention.

Referring now to FIG. 3, a cross section view illustrating forming an isolation layer 302 on the upper surface of the second dielectric layer 108 and in the openings 202 (FIG. 2) is shown. The isolation layer 302 may be formed by first depositing an insulating material on the second dielectric layer 108 and the first metal oxide layer 204 using a conventional deposition process, such as, for example, ALD, CVD, PECVD, MBD, PLD, LSMCD, sputtering, chemical solution deposition, or evaporation. In an embodiment, the insulating material may be composed of dielectric material such as, for example, $SiO_5$, $SiO_x$, $SiO_xN_y$, $Si_3N_4$, $Al_2O_3$, or $TiO_2$. After the insulating material is deposited, it may be planarized, using a conventional planarization process, such as CMP, to form the isolation layer 302. The isolation layer 302 may have an upper surface that is substantially flush with the upper surface of the first metal oxide layer 204. In an embodiment, the upper surface of second dielectric layer 108 may be completely covered by the isolation layer 302 in all regions not covered by the first metal oxide layer 204.

Figure 4A:
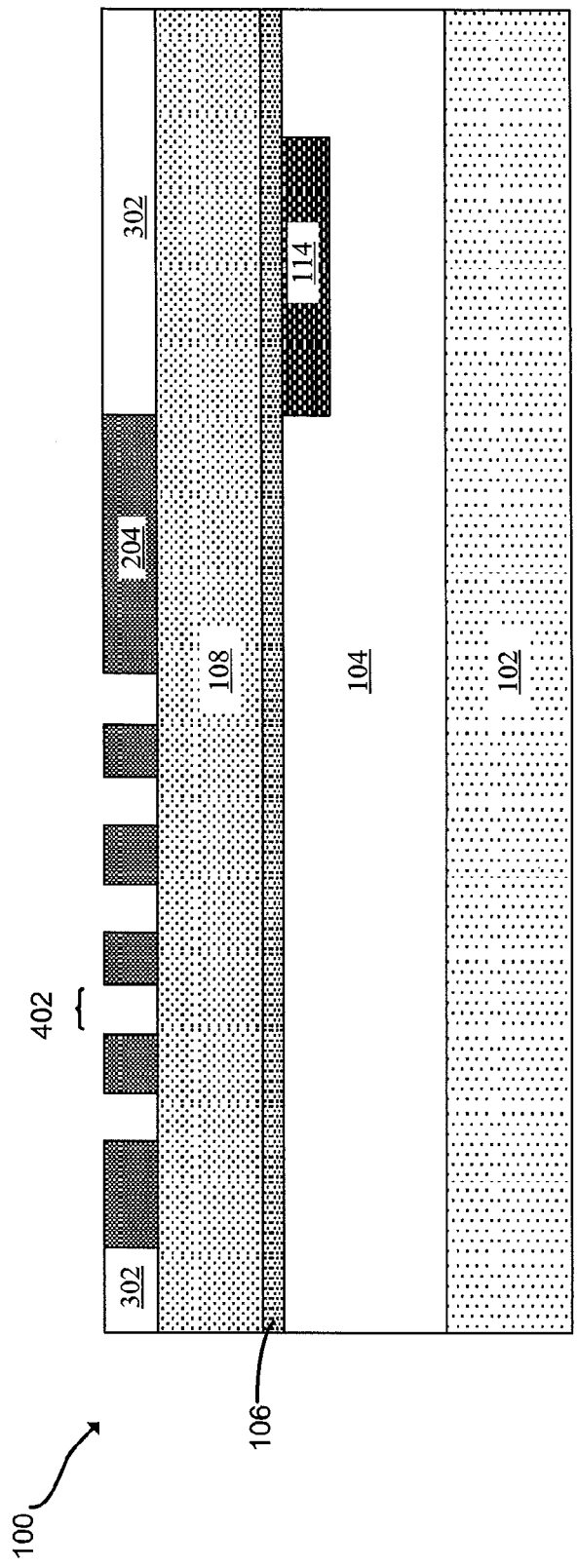
FIG. 4A is a cross section view and FIG. 4B is a top view, both illustrating patterning the isolation layer, according to an embodiment of the present invention.
Figure 4B:
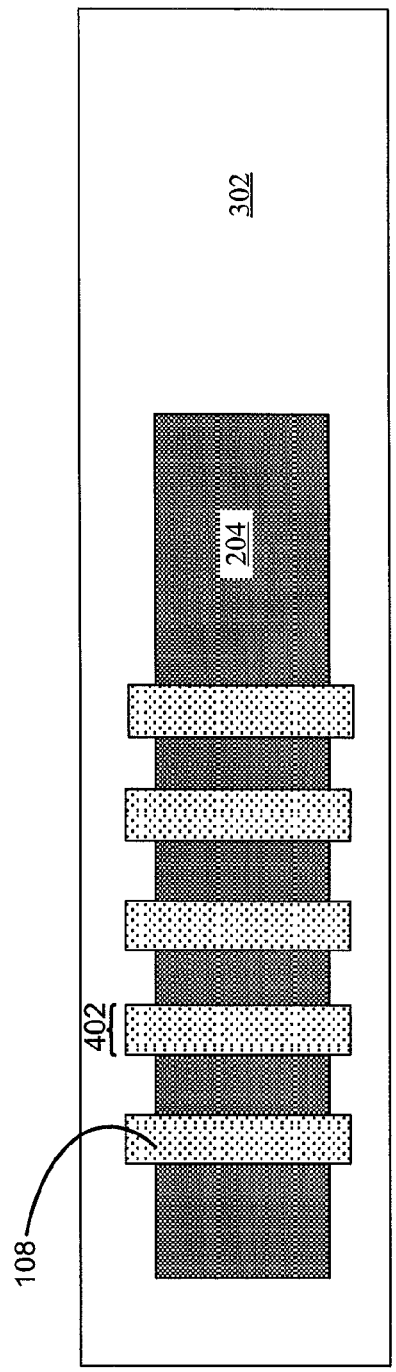

Referring now to FIGS. 4A and 4B, a cross section view and a top view illustrating forming one or more openings 402 in the isolation layer 302 are shown. The openings 402 may be formed by removing a portion of the isolation layer 302 between the first metal oxide layer 204 to expose the upper surface of the second dielectric layer 108. In an embodiment, the openings 402 may be formed using a conventional patterning and etching process. In another embodiment, the openings 402 may be formed by removing a portion of the isolation layer 302 selective to the first metal oxide layer 204 and the second dielectric layer 108 using a selective etching process, such as, for example, reactive ion etching (RIE).

Referring now to FIGS. 5A and 5B, a cross section view and a top view illustrating forming a second metal oxide layer 504 on the upper surface of the second dielectric layer 108 in the openings 402 (FIGS. 4A and 4B) are shown. The second metal oxide layer 504 may be formed using techniques substantially similar to those used to form the first metal oxide layer 204 described above with reference to FIG. 2. In an embodiment, the second metal oxide layer 504 may be composed of the same material as the first metal oxide layer 204. In an alternate embodiment, the second metal oxide layer 504 may be composed of a different metal oxide material than the first metal oxide layer 204. In an embodiment, the second metal oxide layer 504 may be composed of bismuth oxide ($B_2O_3$), which may or may not be doped with, for example, aluminum oxide ($Al_2O_3$). The second metal oxide layer 504 may have an upper surface that is substantially flush with the upper surface of the first metal oxide layer 204. The deposition of the second metal oxide layer 504 in the openings 402 may result in the formation of a continuous layer of alternating regions of zinc oxide and bismuth oxide.

As described above with reference to formation of the first metal oxide layer 204 (FIG. 2), the second metal oxide layer 504 may be deposited at a low temperature using the sputtering process in an atmosphere of an inert gas, such as argon, helium, neon, krypton, xenon, or radon. In an embodiment, the deposition temperature may remain below approximately 400° C. The second metal oxide layer 504 may then be subjected to heating through a low temperature anneal process at a temperature of approximately 350° C. for a period of between approximately 30 seconds and several hours. By following this procedure, the properties of the layer materials may be easily controlled, resulting in the formation of a highly-stable second metal oxide layer 504, without causing damage to the substrate 102 or adjacent devices (not shown). In an embodiment, the annealing process may be carried out at a temperature lower than the maximum temperature reached during the deposition of the second metal oxide layer 504. In another embodiment, the annealing process may be carried out at a temperature higher than the maximum temperature reached during the deposition of the second metal oxide layer 504. In an embodiment, the annealing of the first metal oxide layer 204 and the annealing of the second metal oxide layer 504 may be carried out concurrently rather than separately.

Figures 6A, 6B:
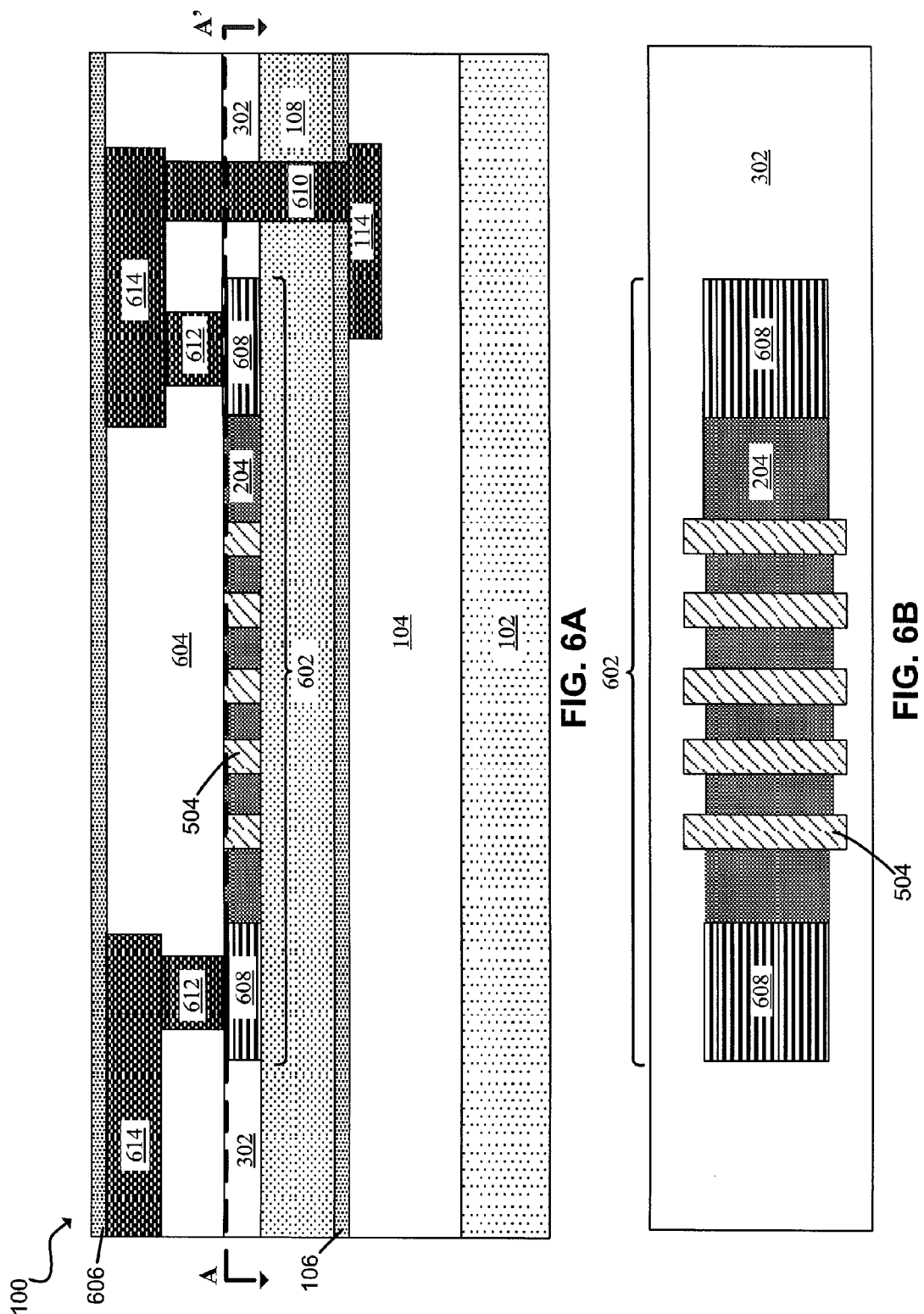
FIG. 6A is a cross section view and FIG. 6B is a top view, both illustrating forming electrodes, a third dielectric layer, and additional wiring layers along with associated interconnect via/lines, according to an embodiment of the present invention.

Referring now to FIG. 6A, a cross section view illustrating forming electrodes 608 on the second dielectric layer 108 in electrical contact with the first metal oxide layer 204 and the second metal oxide layer 504 to form a lateral thin film varistor 602 is shown. The electrodes 608 may be formed in the isolating layer 302 by forming openings (not shown) adjacent to the first metal oxide layer 204 using a conventional patterning and etching process. The openings may then be filled by sputtering a conductive material into position at a low temperature using conventional sputtering techniques such as DC magnetron or R.F. sputtering.

The electrodes 608 may be composed of, for example, polySi, a conductive metal, a conductive metal silicide, or combinations thereof. In a preferred embodiment, the conductive material may be a conductive metal such as Cu, W, Al, or alloys thereof. After the conductive material is deposited, a conventional planarization process such as, for example, chemical mechanical polishing (CMP) may be performed so that the electrodes 608 have an upper surface that is substantially flush with the upper surface of the first metal oxide layer 204. In an embodiment, the electrodes 608 may be separated from the isolation layer 302 by a barrier layer (not shown).

In an embodiment, a third dielectric layer 604 may be formed on the isolation layer 302, the first metal oxide layer 204, the second metal oxide layer 504, and the electrodes 608. The third dielectric layer 604 may be substantially similar to the first dielectric layer 104 in composition and may formed using substantially similar techniques as those described above with reference to formation of the first dielectric layer 104 (FIG. 1). One or more conductive features, including lines 614 and vias 612, may be formed in the third dielectric layer 604. In an embodiment, an interconnect 610 may be formed extending through the third dielectric layer 604, the isolation layer 302, the second dielectric layer 108, and the capping layer 106 to contact the conductive feature 114. The lines 614, the vias 612, and the interconnect 610 may be formed using conventional patterning and etching techniques followed by depositing conductive material in the etched openings. The lines 614, the vias 612, and the interconnect 610 may be composed of a conductive material substantially similar to the conductive material used to form the conductive feature 114. In an embodiment, the lines 614, the vias 612, and the interconnect 610 may include a barrier layer (not shown).

In an embodiment, a top capping layer 606 may be formed on the third dielectric layer 604, and the lines 614. The top capping layer 606 may be substantially similar in composition to the capping layer 106 and may formed using substantially similar techniques as those described above with reference to capping layer 106 in FIG. 1. It should be noted that additional interconnect wiring layers such as $M_{x+1}$, $M_{x+2}$, etc. (not shown) may be fabricated on an upper surface of the capping layer 606 using techniques well known in the art.

Referring now to FIG. 6B, a cross section view along section line A-A' (FIG. 6A) illustrating the lateral thin film varistor 602 is shown.

Embodiments of the present invention may overcome limitations associated with generic transient voltage suppression (TVS) devices and traditional embedded electrostatic discharge (ESD) devices, which may be incapable of handling higher voltage surges in IC chips with thin film substrates. Conventional varistors, thin film or otherwise, that are configured for vertical flow of transient currents between vertically placed electrodes may impose space limitations as IC chip wiring levels continue to get shorter while simultaneously an increasing number of semiconductor devices are getting stuffed within these squeezed spaces. In addition, high temperature sintering that is generally employed in vertical thin film varistor fabrication may cause permanent damage to nearby electrodes, thin film substrates and other embedded semiconductor devices.

The lateral configuration of the proposed lateral thin film varistor requires minimal vertical space and thus may easily fit within the decreasing IC chip wiring level heights. The proposed lateral thin film varistor and the associated electrodes may be fabricated using low temperature sputtering followed by low temperature annealing, thereby avoiding damage to the thin film substrate and other contiguous semiconductor devices embedded within the IC chip. The proposed lateral thin film varistor may possess stable voltage performance characteristics even in thin layer configurations and may be capable of handling higher levels of voltage surges for longer durations of time without disruption in the varistor's functionality. The lateral thin film varistor may remain stable at higher temperatures that may be caused by the higher transient voltage surges. In addition, by adjusting one of the deposition and/or anneal treatment conditions, the electrical characteristic of the lateral thin film varistor's metal oxide material may be altered to better fit an IC chip's functionality and utility.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a lateral thin film varistor comprising:

forming a continuous layer comprising alternating regions of a first metal oxide layer and a second metal oxide layer between two laterally spaced electrodes using sputtering process followed by an annealing process, including forming the first metal oxide layer comprised of a plurality of spaced apart sections of the first metal oxide on a dielectric layer, forming a pair of isolation layer sections, comprised of an insulating material, on the dielectric layer, laterally outside the first metal oxide layer, and forming the second metal oxide layer comprised of a plurality of spaced apart sections of the second metal oxide on the dielectric layer, between the pair of isolation layer sections, each of the sections of the second metal oxide layer being located between a pair of the sections of the first metal oxide layer.

2. The method of claim 1, wherein the first metal oxide layer comprises zinc oxide.

3. The method of claim 1, further comprising doping the first metal oxide layer with aluminum oxide.

4. The method of claim 1, wherein the second metal oxide layer comprises bismuth oxide.

5. The method of claim 1, further comprising doping the second metal oxide layer with aluminum oxide.

6. The method of claim 1, wherein the annealing process is carried out in an inert gas atmosphere.

7. The method of claim 1, wherein the annealing process comprises heating the continuous layer to a temperature not exceeding a maximum temperature reached during the sputtering process.

8. A method of forming a lateral thin film varistor comprising:
forming a first metal oxide layer on a dielectric layer;
removing portion of the first metal oxide layer to separate the first metal oxide layer into a plurality of spaced apart sections of the first metal oxide layer on the dielectric layer;
forming a pair of isolation layer sections, comprised of an insulating material, on the dielectric layer, laterally outside the first metal oxide layer;
forming a plurality of spaced apart sections of a second metal oxide layers on the dielectric layer, between the pair of isolation layer sections, wherein each of the sections of the second metal oxide layer is located between a pair of the sections of the first metal oxide layer, and the first metal oxide layer and the second metal oxide layer form a continuous layer of alternating sections of the first and second metal oxide layers;
removing portion of the isolation layer sections adjacent to the continuous alternating layer to form openings exposing an upper surface of the dielectric layer; and
forming electrodes in the opening, the electrodes being adjacent to and contacting the continuous alternating layer.

9. The method of claim 8, wherein the forming of the first metal oxide layer on the dielectric layer comprises depositing zinc oxide using a sputtering process.

10. The method of claim 8, wherein the forming of the second metal oxide layer in the opening comprises depositing bismuth oxide using a sputtering process.

11. The method of claim 8, further comprising doping the first metal oxide layer with aluminum oxide.

12. The method of claim 8, further comprising doping the second metal oxide layer with aluminum oxide.

13. The method of claim 8, further comprising performing an annealing process.

14. The method of claim 13, wherein the annealing process comprises heating the first metal oxide layer and the second metal oxide layer to a temperature not exceeding approximately 350° C.

15. The method of claim 13, wherein the annealing process comprises heating the second metal oxide layer to a temperature not exceeding approximately 350° C.

16. The method of claim 13, wherein the annealing process comprises heating the first metal oxide layer and the second metal oxide layer to a temperature not exceeding a maximum temperature reached during the sputtering process.

17. The method of claim 8, further comprising:
forming a wiring level on the continuous layer of alternating sections of the first and second metal oxide layers, the electrodes, and the isolation layer;
forming conductive features in the wiring level, the conductive features being in electrical contact with the electrodes.

* * * * *